United States Patent
Gibson et al.

(10) Patent No.: US 6,553,453 B1
(45) Date of Patent: Apr. 22, 2003

(54) VARIABLE WIDTH CONTENT ADDRESSABLE MEMORY DEVICE FOR SEARCHING VARIABLE WIDTH DATA

(75) Inventors: G. F. Randall Gibson, Nepean (CA); Farhad Shafai, Kanata (CA)

(73) Assignee: SiberCore Technologies, Inc., Ontario (CA)

(*) Notice: Subject to any disclaimer, the term of this patent is extended or adjusted under 35 U.S.C. 154(b) by 260 days.

(21) Appl. No.: 09/654,316

(22) Filed: Sep. 1, 2000

Related U.S. Application Data

(60) Provisional application No. 60/167,155, filed on Nov. 23, 1999, provisional application No. 60/166,964, filed on Nov. 23, 1999, and provisional application No. 60/153,388, filed on Sep. 10, 1999.

(51) Int. Cl.[7] ............................ G06F 12/04; G11C 15/00
(52) U.S. Cl. ................................... 711/108; 365/49
(58) Field of Search ............................. 711/108; 365/49

(56) References Cited

U.S. PATENT DOCUMENTS

| | | | |
|---|---|---|---|
| 4,376,974 A | 3/1983 | Stewart et al. | 711/100 |
| 4,532,606 A | 7/1985 | Phelps | 365/49 |
| 4,559,618 A | 12/1985 | Houseman et al. | 365/49 |
| 4,622,653 A | 11/1986 | McElroy | 365/49 |
| 4,646,271 A | 2/1987 | Uchiyama et al. | 365/49 |
| 4,670,858 A | 6/1987 | Almy | 365/49 |
| 4,723,224 A | 2/1988 | Van Hulett et al. | 365/49 |
| 4,758,982 A | 7/1988 | Price | 364/900 |
| 4,794,559 A | 12/1988 | Greenberger | 365/49 |
| 4,996,666 A | 2/1991 | Duluk, Jr. | 365/49 |
| 5,051,949 A | 9/1991 | Young | 365/49 |
| 5,185,888 A | 2/1993 | Tanaka et al. | 707/7 |
| 5,226,005 A | 7/1993 | Lee et al. | 365/49 |
| 5,257,220 A | 10/1993 | Shin et al. | 365/49 |
| 5,319,590 A | 6/1994 | Montoye | 365/49 |
| 5,327,372 A * | 7/1994 | Oka et al. | 365/49 |

(List continued on next page.)

FOREIGN PATENT DOCUMENTS

| | | |
|---|---|---|
| EP | 491 498 A2 | 6/1992 |
| EP | 899 668 A2 | 3/1999 |
| WO | 99/23664 | 5/1999 |

OTHER PUBLICATIONS

Ghose, "*The architecture of response–pipelined content addressable memories*", Jul. 1994, Microprocessing & Microprogramming, No. 6, Dept. of Computer Science, NY.

(List continued on next page.)

*Primary Examiner*—Glenn Gossage
(74) *Attorney, Agent, or Firm*—Martine & Penilla, LLP

(57) ABSTRACT

Variable width Content Addressable Memory (CAM) devices for searching data of variable widths, are disclosed. The CAM devices include, a plurality of CAM blocks and a plurality of dual-mode first encoders. The plurality of CAM blocks is configured to store a plurality of data of variable widths with each data having one or more data portions of one or more predetermined widths. Each CAM block is configured to store a predetermined width portion of the data such that each data is stored in one or more CAM blocks. The CAM blocks receive a search data having a specified number of search data portions with each search data portion having one or more predetermined widths. Each CAM block receives a search data portion of the search data for searching the search data in the CAM blocks. The plurality of dual mode first encoders is configured for concatenating the specified number of the CAM blocks to generate one or more search results. A set of the dual mode first encoders concatenates the specified number of CAM blocks to match the width of the search data. The remaining dual mode first encoders generate one or more search results when the concatenated CAM blocks contain data that matches the search data.

31 Claims, 11 Drawing Sheets

U.S. PATENT DOCUMENTS

| | | | |
|---|---|---|---|
| 5,351,208 A | | 9/1994 | Jiang .......................... 365/49 |
| 5,568,415 A | | 10/1996 | McLellan et al. ............. 365/49 |
| 5,608,662 A | | 3/1997 | Large et al. ........... 364/724.01 |
| 5,699,288 A | | 12/1997 | Kim et al. .................... 365/49 |
| 5,752,260 A | | 5/1998 | Liu ............................. 711/129 |
| 5,784,709 A | | 7/1998 | McLellan et al. ........... 711/207 |
| 5,787,458 A | * | 7/1998 | Miwa ......................... 711/108 |
| 5,818,786 A | | 10/1998 | Yoneda ................. 365/230.03 |
| 5,828,593 A | | 10/1998 | Schultz et al. ................ 365/49 |
| 5,859,791 A | | 1/1999 | Schultz et al. ................ 365/49 |
| 6,000,008 A | * | 12/1999 | Simcoe ....................... 711/108 |
| 6,006,306 A | | 12/1999 | Haywood et al. ........... 711/108 |
| 6,044,005 A | | 3/2000 | Gibson et al. ................ 365/49 |
| 6,069,573 A | * | 5/2000 | Clark, II et al. ............ 711/108 |
| 6,081,440 A | | 6/2000 | Washburn et al. ............ 365/49 |
| 6,199,140 B1 | | 3/2001 | Srinivasan et al. ......... 711/108 |
| 6,243,281 B1 | * | 6/2001 | Pereira ......................... 365/49 |
| 6,253,280 B1 | * | 6/2001 | Voelkl ....................... 711/108 |

OTHER PUBLICATIONS

Yamagata, Mihara, Hamamoto, Murai, Kobayashi, "*A 288–kb Fully Parallel Content Addressable Memory Using a Stacked–Capacitor Cell Structure*", Dec. 27, 1992, IEEE Journal of Solid State Circuits, vol. 27, No. 12, NY.

Uvieghara, Nakagome, Jeong, Hodges, "*An On–Chip Smart Memory for a Data–Flow CPU*", Feb. 25, 1990, IEEE Journal of Solid–State Circuits, No. 1, NY.

Podaima et al., "*A self–timed, fully–parallel content addressable queue for switching applications*", Database # 6467785, XP002153665 Abstract, IEEE May, 1999 Custom Int. Circuits Conf. (Cat. # 99CH36327), San Diego, CA.

* cited by examiner

VARIABLE WIDTH CONTENT ADDRESSABLE MEMORY DEVICE FOR SEARCHING VARIABLE WIDTH DATA

CROSS REFERENCE TO RELATED APPLICATIONS

This application claims priority from U.S. Provisional Patent Application No. 60/153,388 filed Sep. 10, 1999, and entitled "Content Addressable Memory Circuitry."

This application is also related to U.S. Provisional Patent Application No. 60/167,155 filed on Nov. 23, 1999, and entitled "Three Port Content Addressable Memory Circuit and Methods for Implementing the Same." This application is further related to U.S. Provisional Patent Application No. 60/166,964 filed on Nov. 23, 1999, and entitled "Content Addressable Memory Circuit with Redundant Array and Method for Implementing the Same." These applications are incorporated herein by reference.

BACKGROUND OF THE INVENTION

1. Field of the Invention

The present invention relates generally to memory devices, and more particularly to content addressable memory devices that can be searched in variable data width.

2. Description of the Related Art

Memory devices are indispensable components of modern computer systems and networks. As storage devices, they are used to provide fast access to data and instructions stored therein. Content addressable memory (CAM) is a special type of memory that is often used for performing address searches. For example, Internet routers often include a CAM for searching the address of specified data. The use of CAMs allows the routers to perform fast searches to allow computer systems to communicate data with one another over networks. In addition, CAMs are also utilized in numerous other areas such as database searches, image processing, and voice recognition applications, where fast search performance is desired.

As is well known, CAMs typically include a two-dimensional row and column content addressable memory array of core cells, such that each row contains an address, pointer, or bit pattern entry. Within such an array of cells, a CAM may perform "read" and "write" operations at specific addresses like a conventional random access memory (RAM). In addition, the CAM is also used to perform fast search operations that simultaneously compare a bit pattern of data against an entire list (e.g., column) of pre-stored entries (e.g., rows) of bit patterns in the CAM array. Based on these comparisons, the CAM typically outputs a result in the form of an address, pointer, or bit pattern corresponding to an entry that matches the input data. By thus performing comparisons simultaneously of all CAM entries, the CAM provides significant savings in search time over RAMs such as dynamic RAMs (DRAMs), static RAMs (SRAMs), and the like.

In modern computer systems and networks, CAMs are often used in various applications having different data size requirements. In Internet routers and switches, for example, a CAM may be used in medium access control (MAC) level switching, asynchronous transfer mode (ATM), and various network layer protocols such as Internet protocol (IP) versions 4 (Ipv4), 6 (Ipv6), and the like. As is well known in the art, the ATM often uses 32-bit data fields while the MAC level 2 addressing typically uses 48 to 64-bit data sizes. The data sizes may vary further depending on specific applications. For example, the 64-bit data size for the MAC level addressing may be increased to 128 bits when both the source and destination addresses are used in switching.

To address such varying data size requirements, one conventional approach has employed a CAM chip with a multitude of macros, each of which is configurable to a specific data size requirement. FIG. 1A shows a block diagram of a conventional CAM chip 100 having four macros 102, 104, 106, and 108. Each of the macros 102, 104, 106, and 108 is configurable by a user to specified widths for various applications. For example, the macro 102 is configured as a 4K×64 block (i.e., 4K entries of 64 bit data width); the macros 104 and 108 are configured as an 8K×32 block (i.e., 8K entries of 32 bit data width); and the macro 106 is configured as a 2K×128 block (i.e., 2K entries of 128 bit data width). Thus, in this arrangement, all entries in a single macro have the same width.

FIG. 1B illustrates a block diagram of a macro 120 depicting various widths into which it can be configured. As shown, the macro 120 includes a plurality of blocks 122, 124, 126, 128, and 130, which can be configured into 32-bit width, 64-bit width, 128-bit width, or 256-bit width. For example, each of the blocks 122, 124, 126, and 128 may be used to provide 32-bit width. Alternatively, blocks 122 and 124 may be used to provide data width size of 64 bits.

Unfortunately, however, the width of conventional macros 102, 104, 106, 108, and 120 is typically configurable on the block level only using associated registers that specify data size for each of the macros. This means that each of the macros 102, 104, 106, 108, and 120 cannot accommodate more than one data size at the same time. The configuration of macros at the block level often results in wasting of valuable memory space. For example, if the macro 120 can accommodate 128 bit data width but is actually configured into 64 bit data width, half of the memory space will not be used, thus resulting effectively in the waste of 50% of memory space. Likewise, if the macro 120 can support up to 64-bit data width but is configured into 32-bit data size, half of the memory space will be lost. In addition, the use of macros generally requires the users or customers to be intimately knowledgeable about the macros and their data sizes to avoid overflow of the macros. Furthermore, if the macros are reprogrammed to different data sizes, valuable data (e.g., search statistics) could be lost in the process.

Thus, what is needed is a CAM device that can store variable data size widths for searching variable width data without wasting valuable memory space, thereby maximizing the usage of CAM space with attendant savings in cost.

SUMMARY OF THE INVENTION

The present invention fills these needs by providing variable width CAM devices for searching data of variable widths. It should be appreciated that the present invention can be implemented in numerous ways, including as a process, an apparatus, a system, a device, or a method. Several embodiments of the present invention are described below.

In one embodiment, the present invention provides a variable width CAM device for searching data of variable widths. The CAM device includes a plurality of CAM blocks and a plurality of dual-mode first encoders. The plurality of CAM blocks is configured to store a plurality of data of variable widths with each data having one or more data portions of one or more predetermined widths. Each CAM block is configured to store a predetermined width portion of the data such that each data is stored in one or more CAM blocks. The CAM blocks receive a search data having a specified number of search data portions with each search data portion having one or more predetermined widths. Each CAM block receives a search data portion of the search data for searching the search data in the CAM blocks. The plurality of dual mode first encoders is configured for concatenating the specified number of the CAM blocks to generate one or more search results. A set of the dual mode first encoders concatenates the specified number of CAM blocks to match the width of the search data. The remaining dual mode first encoders generate one or more search results when the concatenated CAM blocks contain data that matches the search data.

In another embodiment, the present invention provides a variable width CAM device including a plurality of CAM blocks and a plurality of first encoders. The plurality of CAM blocks is configured for storing a plurality of data having a plurality of widths. Each CAM block has a plurality of entries with each entry being configured to store a predetermined width data portion of one of the plurality of data. Each of the plurality of data is stored in one or more entries that are located in different CAM blocks. The CAM blocks are arranged to receive a search data having a specified number of search data portions such that each CAM block receives one search data portion having the predetermined width. Each entry in the CAM blocks is capable of generating a match result when the predetermined width data portion in each entry matches the search data portion of the predetermined width. The plurality of first encoders is configured to sequentially couple the plurality of CAM blocks in the specified number to match the width of the search data. Each first encoder is associated with one CAM block for receiving the match results from the entries in the associated CAM block. A set of the first encoders transmits the match results from the associated CAM blocks to next sequentially coupled CAM blocks as inputs. Each of the remaining first encoders generates a search result when the sequentially coupled CAM blocks contain data that matches the search data.

In yet another embodiment, a variable width CAM device is disclosed. The variable width CAM includes a plurality of CAM blocks, a plurality of first encoders, and a second encoder. The plurality of CAM blocks is arranged for storing data of variable widths with each CAM block having a plurality of entries. Each entry is configured to store data of a first width. Each CAM block is arranged to receive a first width search data portion of a search data for input to each entry in each CAM block. Each entry in the CAM blocks is capable of generating a match result when the data in each entry matches the search data portion of the first width. The plurality of first encoders is configured to concatenate the entries of the plurality of CAM blocks. Each first encoder is associated with one CAM block for receiving the match results from the entries in the associated CAM block. Each first encoder is arranged to transmit the match results to a next sequentially coupled CAM block as inputs to the entries in the next CAM block. A set of the first encoders is adapted to transmit the match results for concatenating the entries in one or more CAM blocks to match the width of the concatenated entries and the search data. Each of the remaining first encoders generates a search result in response to match results of the concatenated entries. The second encoder is coupled to the plurality of first encoders to receive one or more search results. The second encoder selects one of the received search results for output.

By storing data of variable widths for searching variable width data, the CAM devices of the present invention provide savings in CAM space and enhanced flexibility. For example, the variable width storage and searching of the data provides substantial flexibility to users by allowing the tag bits, which identify the width of an entry, to be programmed on an entry basis instead of block basis. In addition, the storage and searching of variable width data on individual entry basis saves valuable CAM space by eliminating unused or unusable CAM spaces associated with conventional CAM macros. The CAM devices with the variable width storage and searching capabilities are particularly beneficial in multi-protocol applications such as IPv4, IPv6, ATM, MAC level switching, etc. Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

In the following description of the present invention, a variable width CAM device for searching variable width data, numerous specific details are set forth in order to provide a thorough understanding of the present invention. However, it will be obvious to one skilled in the art that the present invention may be practiced without some or all of these specific details. In other instances, well known process operations have not been described in detail in order not to unnecessarily obscure the present invention.

Figure 1A:
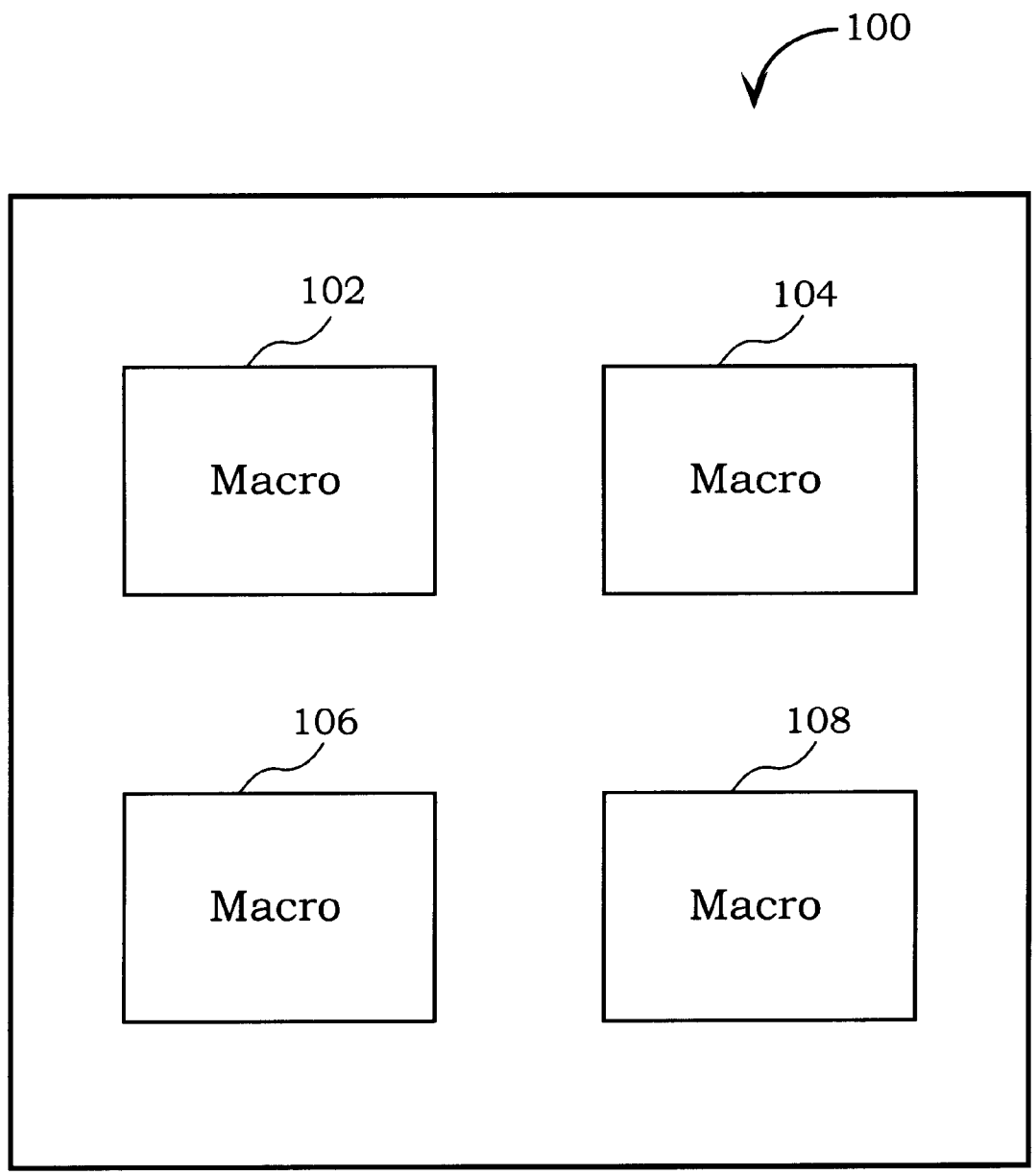
FIG. 1A shows a block diagram of a conventional CAM chip having four macros.
Figure 1B:
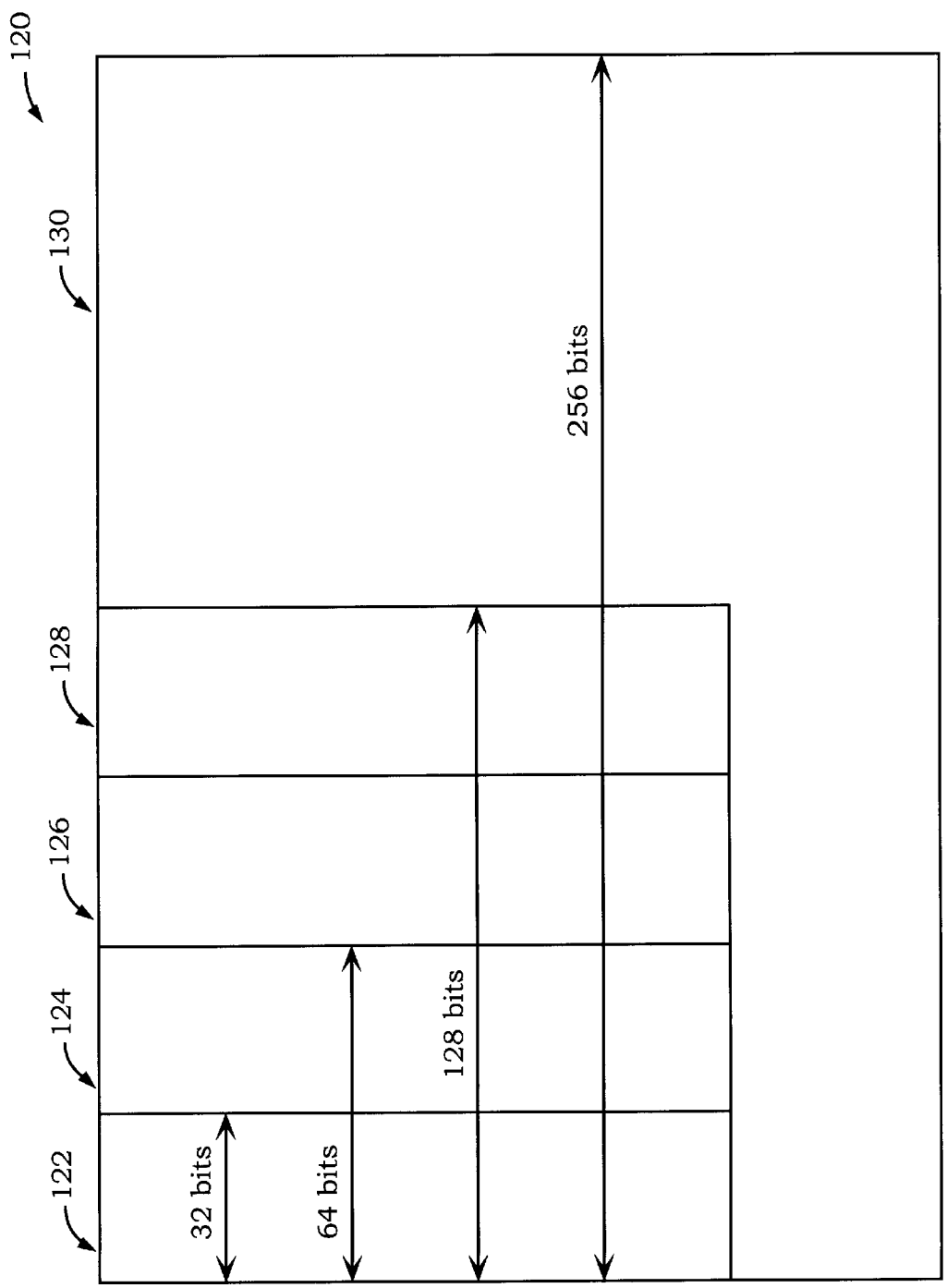
FIG. 1B illustrates a block diagram of a macro depicting various widths into which it can be configured.
Figure 2A:
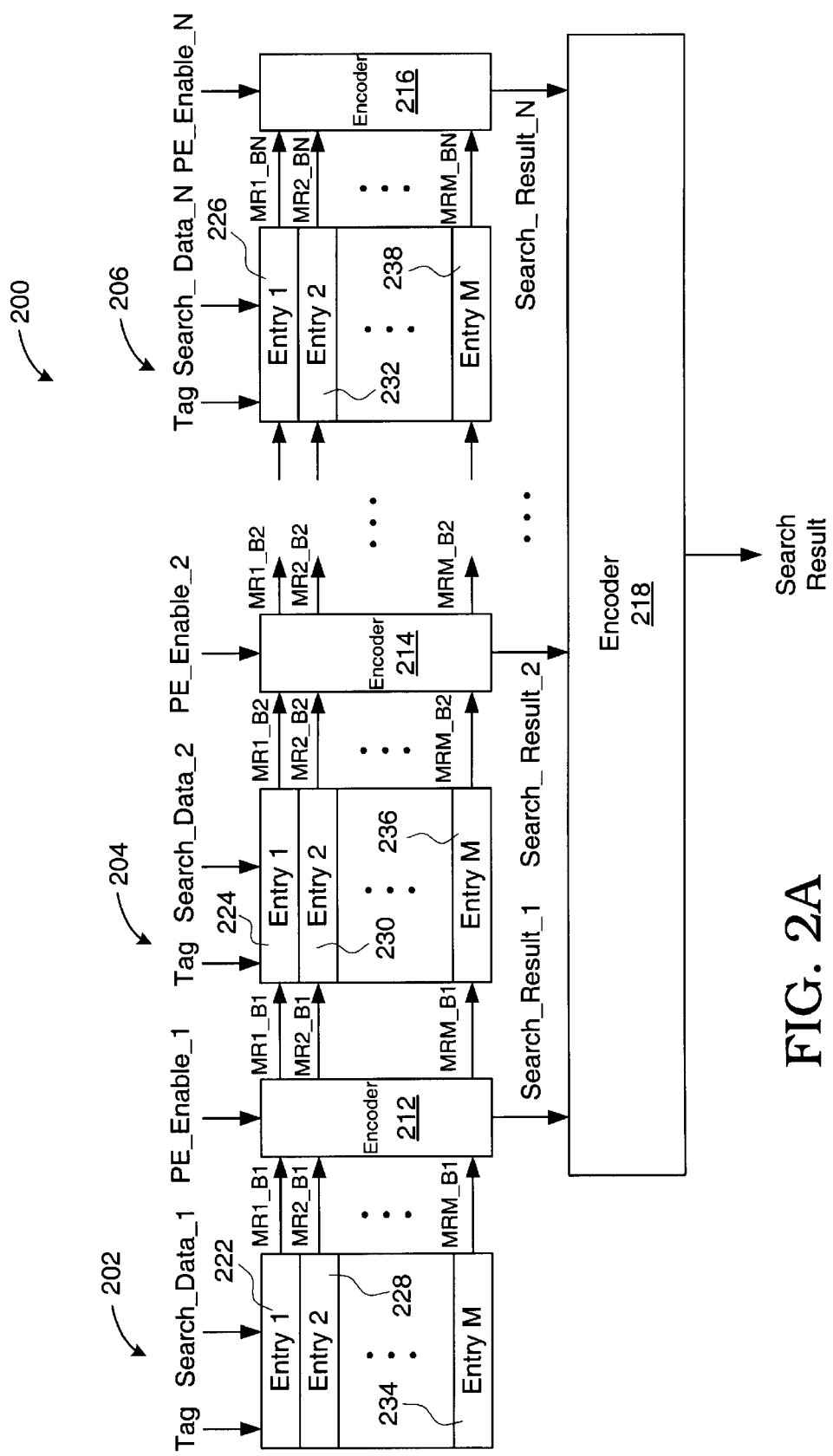
FIG. 2A shows a schematic block diagram of an exemplary CAM device for implementing variable data widths in accordance with one embodiment of the present invention.

FIG. 2A shows a schematic block diagram of an exemplary CAM device 200 for implementing variable data widths in accordance with one embodiment of the present invention. The CAM device 200 includes a plurality of CAM blocks 202, 204, and 206. Each of the CAM blocks 202, 204, and 206 includes M entries from Entry 1 to Entry M. As will be described in more detail below, each entry includes a tag field for storing a tag value and a data field for storing data of a predetermined width. Within each CAM block, the entries are arranged in rows so that one entry is provided for each row. Preferably, the data field for the entries in the CAM blocks 202, 204, and 206 is a uniform size such as 32-bit width. Although the CAM device 200 is illustrated using three CAM blocks 202, 204, and 206, it may employ any number of CAM blocks to implement variable data widths.

For performing a search operation of variable data sizes, the CAM blocks 202, 204, and 206 are configured to receive a tag and a search data as inputs. The tag specifies the width of the search data while the search data is the data to be searched. The tag is preferably the same for all CAM blocks 202, 204, and 206. The search data, however, may be different for each CAM block. For example, the CAM blocks 202, 204, and 206 all receive a single tag of the same value while receiving search data Search_Data_1, Search_Data_2, and Search_Data_N, respectively.

The tag encodes the width of the data to be searched for implementing variable width data storage and search. In one embodiment, a 2-bit tag may be encoded to implement variable data widths from 32-bits to 256-bits as shown in the following Table 1.

TABLE 1

| DATA WIDTH (Bits) | TAG VALUE |
| --- | --- |
| 32 | 00 |
| 64 | 01 |
| 128 | 10 |
| 256 | 11 |

As shown in Table 1, the width of data varies according to the tag value. For example, tag values of "00," "01," "10," and "11" indicate data widths of 32-bits, 64-bits, 128-bits, and 256-bits, respectively. Although the present invention is illustrated by using such a tag scheme, it may implement any number of tag bits to encode any suitable data widths.

As will be discussed in more detail below, each entry in the CAM blocks 202, 204, and 206 includes a tag field and a data field. When storing data in the variable width CAM device 200, a tag value indicating the width (i.e., size) of the data is stored in the tag field along with the associated portion of the data in the data field. In one embodiment, each of the entries in the CAM blocks 202, 204, and 206 includes a data field of 32-bits and a tag field of 2-bits. When storing a 32-bit data in Entry 1 of CAM block 202, for example, a tag value of "00" is also stored in the tag field of the Entry 1. For storing a 64-bit data, two entries are needed. For example, the 64-bit data can be stored in entries 222 and 224 of the CAM blocks 202 and 204, respectively. In this case, the first 32 data bits are stored in the entry 222 while the second 32 data bits are stored in the entry 224. Additionally, a tag value of "01" is stored into the tag fields of both entries 222 and 224 to indicate that these entries contain 64-bit data.

The CAM device 200 includes a plurality of encoders 212, 214, and 216, which are associated with CAM blocks 202, 204, and 206, respectively, for use in search operations. The encoders 212, 214, and 216 receive enable signals PE_Enable_1, PE_Enable_2, and PE_Enable_N, respectively, for either enabling or disabling the encoders. For example, when the enable signals PE_Enable_1, PE_Enable_2, and PE_Enable_N are enabled (e.g., asserted), then the encoders 212, 214, and 216 function to encode match results into search results and select one of the search results, using a predefined algorithm, for output.

However, if the enable signals are disabled (e.g., not asserted), the encoders 212, 214, and 216 do not function as conventional encoders. Instead, they transmit match results from one CAM block to the next CAM block. For example, if the enable signal PE_Enable_1 is not asserted, the encoder 212 is disabled. In this case, the encoder 212 transmits or passes the match results MR1_B1, MR2_B1, and MRM_B1 to the corresponding entries in the next CAM block 204.

In this manner, the CAM blocks 202 and 204 are concatenated for searching a data word of greater than 32-bit width. If a 64-bit word is to be searched, the encoder 212 will be disabled to concatenate CAM blocks 202 and 204 while the encoder 214 is enabled to output Search_Result_2 and prevent transmission of match results to the next CAM block. For a 32-bit data search, all the encoders 212, 214, and 216 are enabled to output search results Search_Result_1, Search_Result_2, and Search_Result_N. At the same time, the CAM blocks 202, 204, and 206 are disconnected from each other to prevent the transmission of match results.

In this configuration, when performing a search operation, a search data and a tag value are provided to each of the CAM blocks 202, 204, and 206 for concurrently comparing the entries. To implement a 32-bit data search, for example, a 32-bit data and a tag of "00" is provided to each of the entries in the CAM blocks 202, 204, and 206. Each entry then generates a match result (MR) in response to the provided tag and data bits. For example, entries 222, 228, and 234 generate match results MR1_B1, MR2_B1, and MRM_B1, respectively, which indicate that the stored data and tag matched the input data and tag. In this 32-bit data search operation, the enable signals to the encoders 212, 214, and 216 are asserted to enable all the encoders in the CAM device 200. The enabling of the encoders serves to disconnect the associated CAM block from the next CAM block. In response, each of the encoders 212, 214, and 216 encodes the generated match results into search results and selects one of the search results as Search_Result_1, Search_Result_2, and Search_Result_N, respectively, for output according to a predefined algorithm. It should be noted that a CAM block may not have an entry that matches the input data and tag so that the associated encoder may not generate a search result indicative of a match.

On the other hand, when performing a 64-bit data search, a tag of "01" and two 32-bit data making up the 64-bit data are provided to a pair of consecutive CAM blocks. For example, the first and second 32 data bits are provided to the CAM blocks 202 and 204 as Search_Data_1 and Search_Data_2, respectively along with the tag value of "01." In addition, the encoder 212 is disabled to allow transmission of match results from CAM block 202 to CAM block 204. In contrast, the encoder 214 is enabled to generate a search result Search_Result_2 for output. All remaining pairs of CAM blocks in the CAM device will function in a similar manner to implement the 64-bit width search.

When enabled, the search results from the encoders 212, 214, and 216 are provided to an encoder 218. The encoder 218 selects one of the search results according to a predefined algorithm and outputs the selected search result. The selected search result is thus an encoded address to the search data according to the predefined algorithm.

Figure 2B:
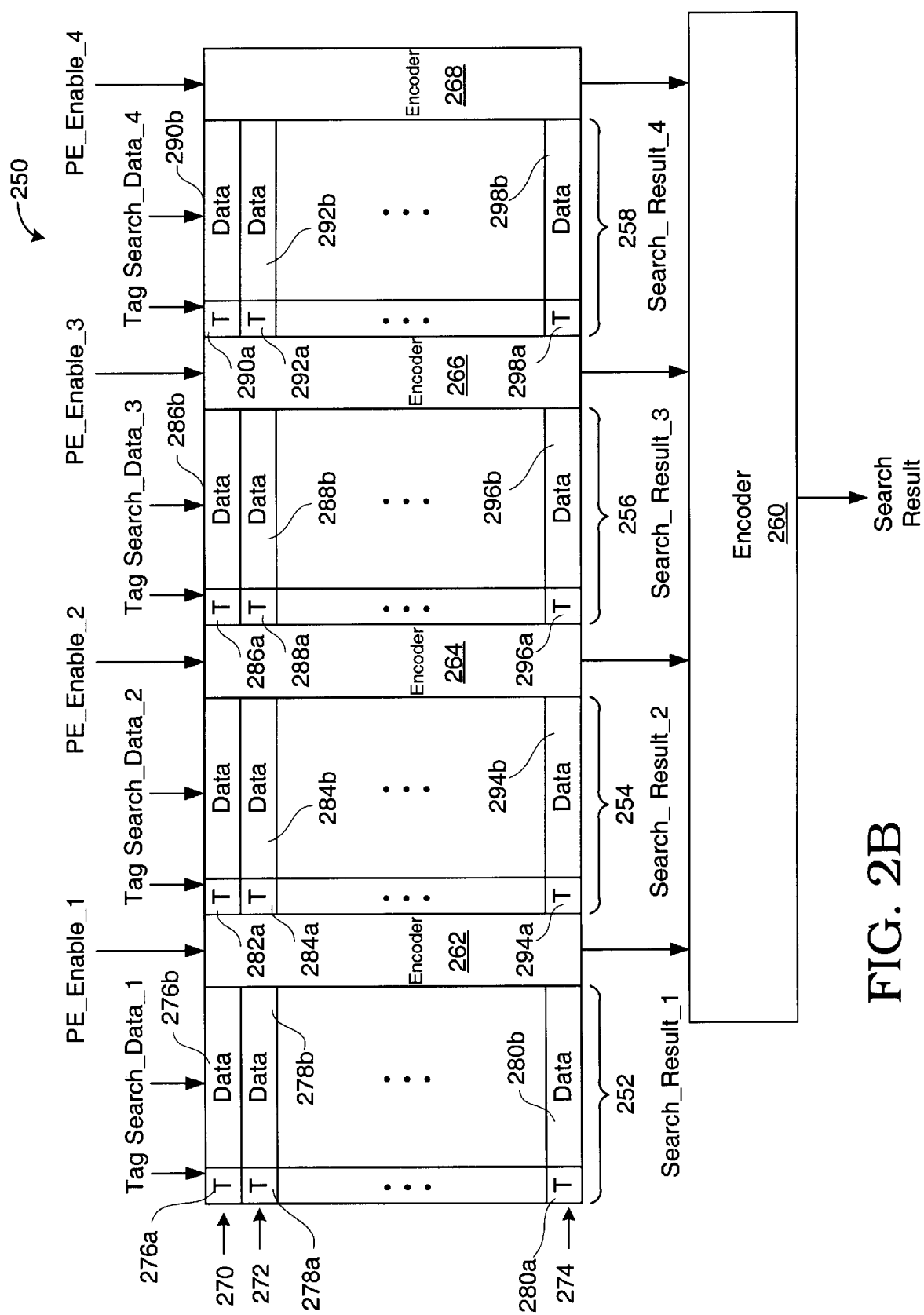
FIG. 2B shows an exemplary CAM device having four CAM blocks in accordance with one embodiment of the present invention.

The CAM device 200 may employ any number of CAM blocks to implement variable data widths. FIG. 2B shows an exemplary CAM device 250 having four CAM blocks 252, 254, 256, and 258 in accordance with one embodiment of the present invention. The CAM device 250 functions in a manner similar to the CAM device 200 described in FIG. 2A. Each entry in the CAM device 250 is shown to include a tag field (T) and a data field. For example, entry 276 includes a tag field 276a and a data field 276b (entry numerals such as 276 are not shown in FIG. 23). Each of the CAM blocks 252, 254, 256, and 258 includes CAM entries having data fields of a specified data width.

By way of example, each of the CAM blocks 252, 254, 256, and 258 is a CAM block having 32-bit data width. That is the entries have 32-bit wide data fields. It should be appreciated, however, that the blocks 252 to 258 may implement any data width (e.g., 16-bit, 32-bit, 64-bit, etc.) to provide desired data size granularity and that the data width need not be the same for each block. In this arrangement, the four CAM blocks 252, 254, 256, and 258 can be used to provide access to data widths in the increment of 32-bits up to 128 bits. For example, a pair of entries 276 (276a, 276b) and 282 (282a, 282b) in row 270 may be used for storing and searching a 64-bit data with a tag value of, for example, "01" while entries 286 (286a, 286b) and 290 (290a, 290b) can be used for searching another 64-bit data with the same tag value of "01." Likewise, all four entries 278 (278a, 278b), 284 (284a, 284b), 288 (288a, 288b), and 292 (292a, 292b) may be used for storing and searching a single 128-bit data with a tag value of, for example, "10" for the entries.

Figure 3A:
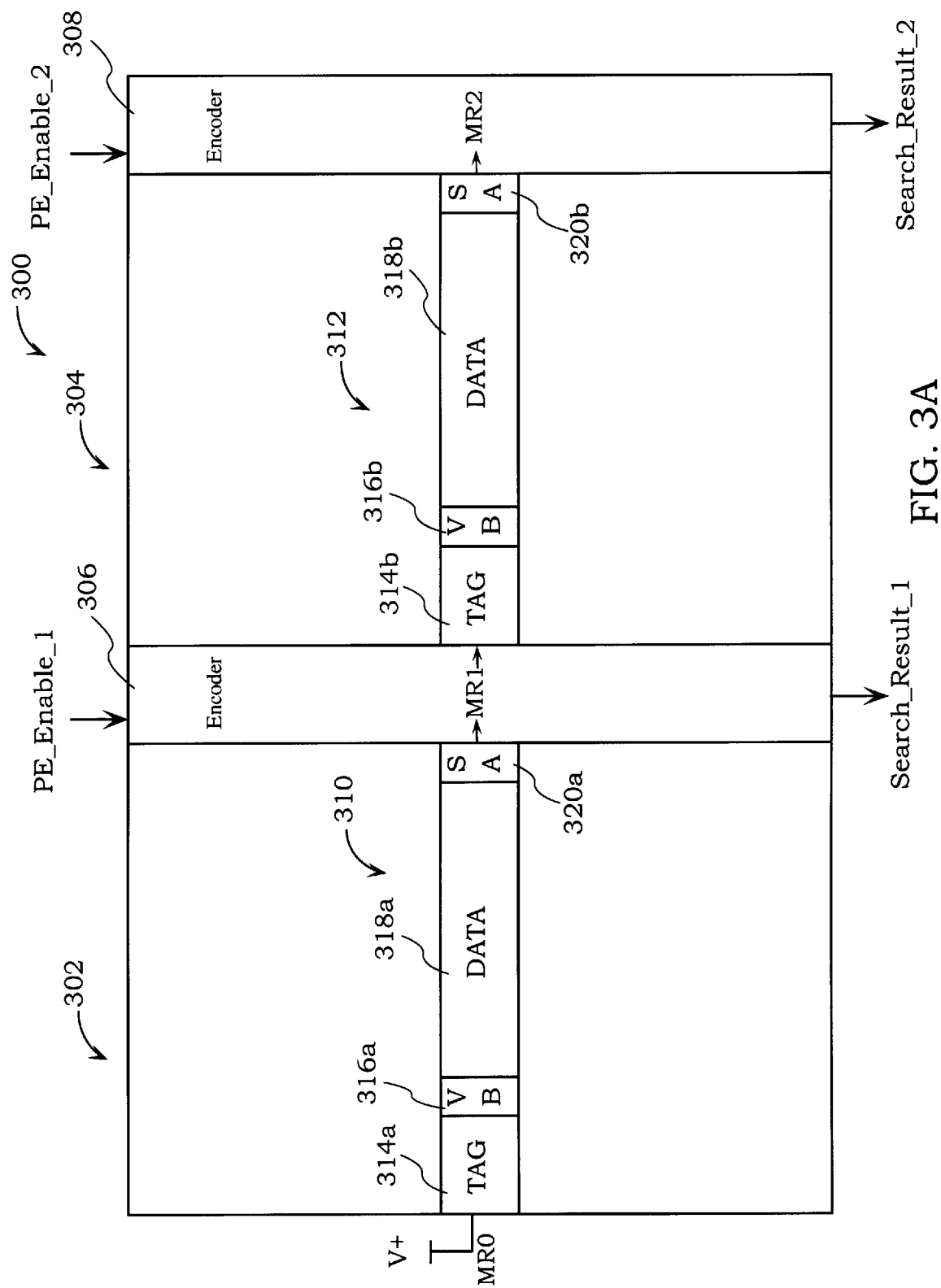
FIG. 3A shows a more detailed schematic block diagram of a pair of entries provided in a pair of CAM blocks of an exemplary CAM device in accordance with one embodiment of the present invention.

FIG. 3A shows a more detailed schematic block diagram of a pair of entries 310 and 312 in CAM blocks 302 and 304, respectively, of an exemplary CAM device 300 in accordance with one embodiment of the present invention. It should be appreciated, however, that the CAM device 300 may have any number of CAM blocks in addition to those shown in FIG. 3A to provide desired variable data with. Each entry in the CAM blocks 302 and 304 includes a tag field 314 (314a and 314b), a valid bit (VB) field 316, and a data field 318. For example, the entry 310 includes a tag field 314a, a valid bit field 316a, and a data field 318a. Similarly, the entry 312 includes a tag field 314b, a valid bit field 316b, and a data field 318b. The data field 318 stores data of specified width. The tag field 314 stores tag bits indicating the width of the overall data of which the data in the data field 318 may form a portion thereof.

The valid bit field 316 is used to store a valid bit indicating whether the associated entry contains valid data. For example, if the valid bit in the valid bit field 316a is asserted, the entry 310 contains valid data in data field 318a. Conversely, if the valid bit is not asserted, the data in the data field 318a is invalid data. The sense amplifier 320 is used to amplify the match result signal for output. For instance, the sense amplifiers 320a and 320b amplify the match result signals MR1 and MR2, respectively, for output to a pair of encoders 306 and 308, respectively.

In this configuration, the encoders 306 and 308 receive encoder enable signals PE_Enable_1 and PE_Enable_2, respectively, for enabling or disabling the encoder functions. When an encoder enable signal is asserted, for example, the associated encoder functions in its conventional encoder mode to encode match results into associated search addresses and select one of the search results as output. When the encoder enable signal is disabled, however, the conventional function of the encoder is disabled and instead, the encoder transmits the received match result signal onto an entry that is preferably located on the same row in the next CAM block.

By way of example, the data fields 318a and 318b may store 32-bit data each with a tag value of "01" in both tag fields 314a and 314b to indicate that the entries 310 and 312 are to be concatenated to form a 64-bit entry. Because the entry 310 contains the first portion of the 64-bit data, the match result (MR0) input is tied to a high supply voltage V+. When performing a 64-bit data search, the PE_Enable_1 will be disabled. This allows the encoder 306 to pass the match result MR1 onto the next entry 312. On the other hand, the PE_Enable_2 signal will be enabled so that the encoder 308 may encode the match result MR2 into a search result. In this manner, the entries 310 and 312 may be effectively concatenated to provide storage and search capability of a single 64-bit entry.

For performing a 32-bit search operation, however, the data fields 318a and 318b may each store a 32-bit data with a tag value of "00" in the associated tag fields 314a and 314b, respectively. In this case, both PE_Enable_1 and PE_Enable_2 signals will be enabled so that the encoders 306 and 308 may encode the match results MR1 and MR2, respectively, into search addresses independently. The CAM device 300 thus provides variable data width storage and search capabilities.

It should be noted that the data, valid bit, and tag fields may also implement ternary equality by allowing the storage of any one of three states: "0," "1," and "X." When applied and stored data, valid, and tag values have valid states "0" and "1," normal binary equality for a match produces a match result when applied data, valid, and tag values are identical to stored data and tag values. In this case, a match is found when the input and stored bits are both "0" or "1" (e.g., 0=0, 1=1). Additionally, under ternary equality, the third state "X" provides a match between applied and stored data and tag values for either "0" or "1" (e.g., 0=X, 1=X, X=0, and X=1).

In a preferred embodiment, the search operation is sequentially pipelined, one block after another. For a 32-bit data search, for example, the search in the CAM blocks 302 and 304 may be performed in two cycles: one search cycle for each CAM block and another cycle for each of the encoders 306 and 308 to generate a search result. Similarly, a 64-bit data search is performed in three cycles: two search cycles for the CAM blocks 302 and 304 and another cycle for the encoder 308 to produce a search result. Likewise, a 128-bit data search may be performed in five clock cycles. Accordingly, the pipelined search operation uses one cycle for each CAM block search and a cycle for the last encoder to produce a search result. Alternatively, the search operations in the CAM blocks may be performed in parallel within a single cycle in a multi-block search mode. In this case, the input search data and the tag values are provided to the CAM blocks in parallel.

Figure 3B:
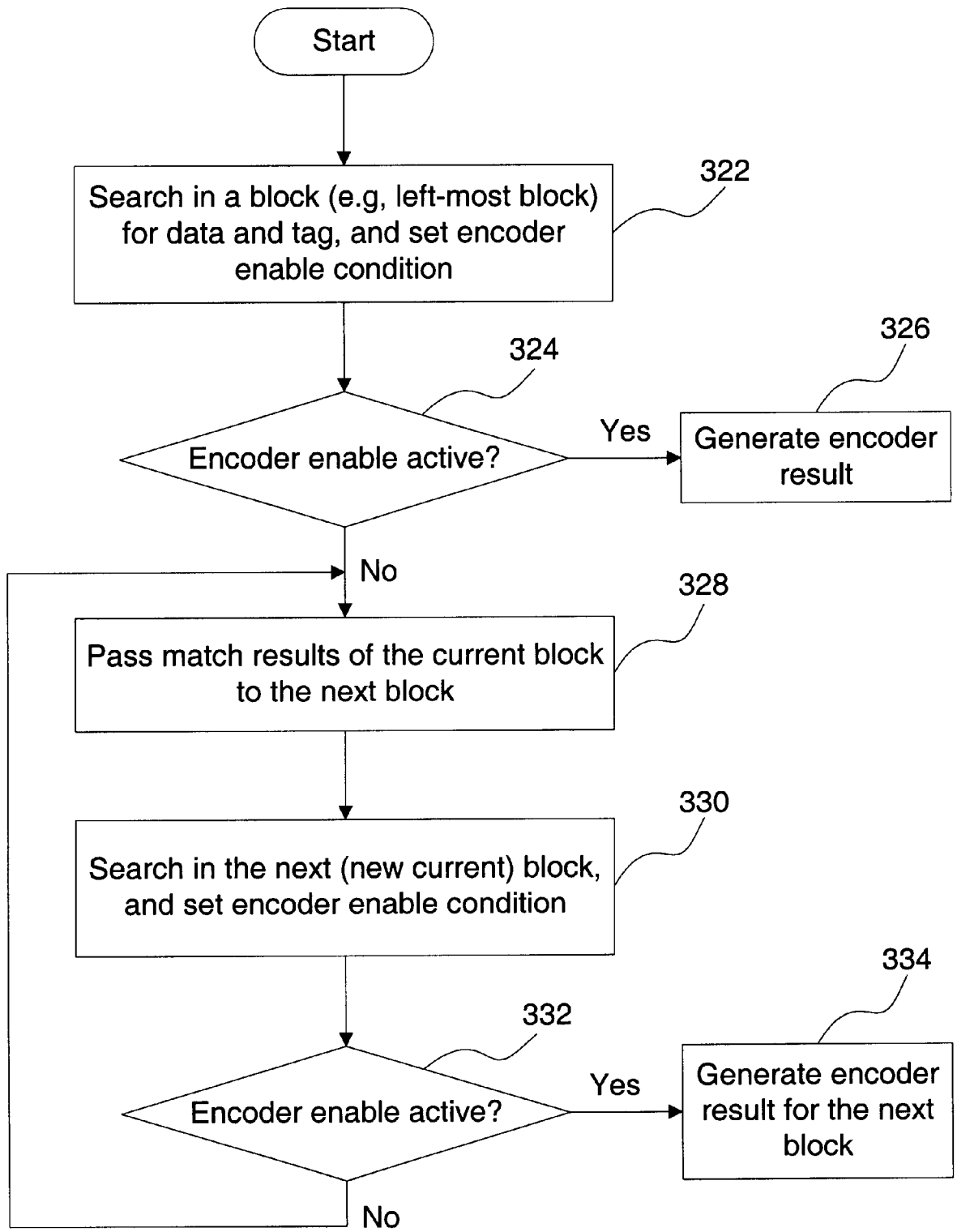
FIG. 3B is a flowchart of an exemplary method for providing variable search data widths in a CAM device in accordance with one embodiment of the present invention.

FIG. 3B is a flowchart of an exemplary method for providing variable search data widths in the CAM device 200, 250, or 300 in accordance with one embodiment of the present invention. The method assumes that data have been stored with associated tags to indicate the proper width of the data. In this method, a left-most CAM block is searched for data and a tag while setting an encoder enable condition by providing an enable signal in operation 322. The encoder enable signal may be either active (e.g., asserted) or inactive (e.g., de-asserted). Then, in operation 324, it is determined whether the encoder enable signal is active. If active, it indicates that the encoder associated with the block functions in conventional encoder mode. In this case, the method proceeds to operation 326 to generate a search result from match results, if any, in operation 326. On the other hand, if the encoder enable signal is inactive, the match results, if any, from the current CAM block are transmitted to the associated entries in the next CAM block in operation 328. As discussed above, an entry in the CAM block generates a match result for transmission to the next block when both the tag and data in the entry match the input tag and search data. For consistency in reference, the current block is now referred to as the previous block while the next block becomes the current block.

Upon receiving the match results, the new current CAM block is searched, in operation 330, for an input data with the same tag used in the previous block. At the same time, the encoder signal for the current CAM block is set and provided to an encoder associated with the current CAM block. Then, in operation 332, it is determined whether the encoder enable signal for the encoder associated with the current block is active. If active, the encoder generates a search result from match results, if any, in operation 334. However, if the encoder enable signal is inactive, this means that the search data width is larger. In this case, the method proceeds back to operation 328, where the match results are passed onto a new next block.

Figure 3C:
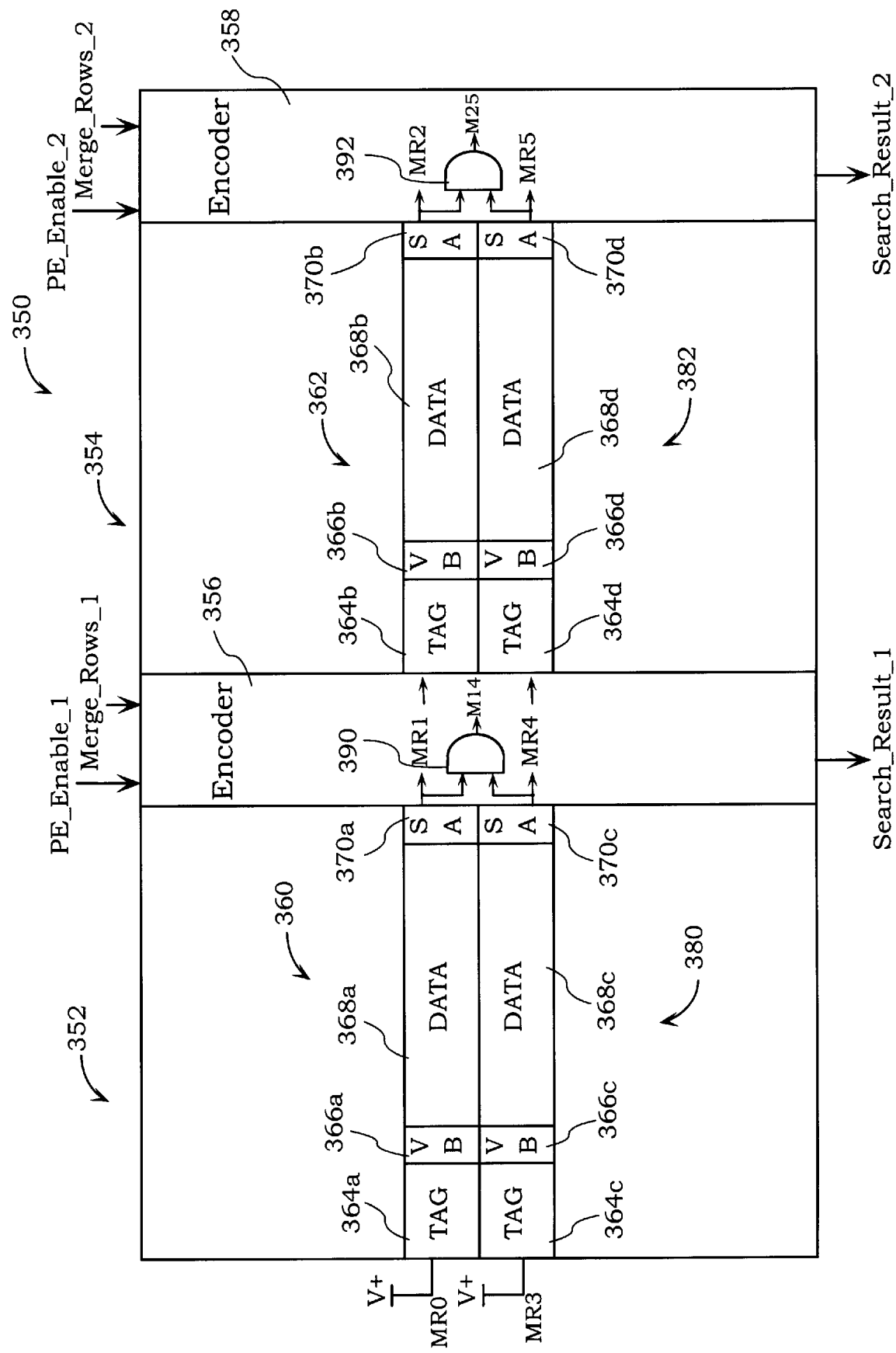
FIG. 3C shows a CAM device configured to store larger width entries using two or more adjacent rows within blocks in accordance with one embodiment of the present invention.

FIG. 3C shows a CAM device configured to store larger width entries using two or more adjacent rows within blocks in accordance with one embodiment of the present invention. The CAM device 350 shown in FIG. 3C is similar to the CAM device 300 shown in FIG. 3A except that the dual mode encoders 306 and 308 in FIG. 3A are replaced by multi-mode encoders 356 and 358. The multi mode encoders 356 and 358 may be operated in the same disabled mode (with PE_Enable_1 and Merge_Rows_1 both low for example) or enabled mode (with PE_Enable_1 high and Merge_Row_1 low for example) as the dual mode encoders 306 and 308. In addition, the multi mode encoders 356 and 358 include a multi row encode mode (when PE_Enable_1 and Merge_Rows_1 are both high for example) and a multi row capture mode (when PE_Enable_1 is low and Merge_Rows_1 is high for example). The four modes for the multi mode encoder are summarized in Table 2 below.

TABLE 2

| Mode | PE_Enable | Merge_Rows | Function |
|---|---|---|---|
| Disabled | low | low | pass match results through to next CAM block |
| Enabled | high | low | encode match results to give Search_Result |
| Multi Row Capture | low | high | store match results from upper rows |

TABLE 2-continued

| Mode | PE_Enable | Merge_Rows | Function |
|---|---|---|---|
| Multi Row Encode | high | high | encode Search_Result from stored upper row match result and lower row match result |

For example, a 128-bit value may be stored in the CAM device 350 assuming 32-bit portions are stored in each entry 360, 362, 380 and 382. The data portions for the 128-bit entry are stored in the data fields 368a, 368b, 368c and 368d, the valid bit for each data portion 366a, 366b, 366c and 366d are all set to the valid state and the tag values are stored in the tag fields 364a, 364b, 364c and 364d. Since-CAM block 352 is the first block, the MR0 and MR3 match result inputs are tied high, and the MR1 and MR4 match result outputs are connected to the match result inputs of the CAM block 354. In this example, a 32-bit entry uses a tag value of 00 and a 64-bit entry uses a tag value of 01 and are searched using the same procedure as if they were being searched for in CAM device 300 with appropriate control of the PE_Enable control signals and applied tag; the Merge_Rows encoder control signals are held low in this case.

The search for a 128-bit entry, since it is stored across two adjacent rows in each block, requires two tag values: the tag value 10 is stored with the upper row entries 360 and 362 while the tag value 11 is stored with the lower row entries 380 and 382. In this manner, two 32-bit search data portions may be applied to the CAM blocks 352 and 354 along with the tag value 10 to generate search results MR1 and MR2 in one search cycle. The encoder controls are set to allow match result MR1 to flow from CAM block 352 to CAM block 354 by disabling encoder 356 (PE_Enable_1 and Merge_Rows_1 are both set low). The MR1 match result is combined with the search result from entry 362 to generate match result MR2 which is captured and stored in the encoder 358 (PE_Enable_2 is low and Merge_Rows_2 is high). In the following search cycle the remaining two 32-bit search data portions are applied to the CAM blocks 352 and 354 along with the tag value 11 and the encoder 356 is disabled to allow match result MR4 to pass to CAM block 354 where it is combined with the search result from entry 382 to generate match result MR5. The encoder 358 is configured in multi row encode mode with encoder control inputs PE_Enable_2 and Merge_Rows_2 both set high. Match result MR5 is logically ANDed with the stored match result MR2 by AND gate 392 to generate a single match result MR25 for the 128-bit entry. The match result MR25 is then encoded by the encoder 358 to generate Search_Result_2.

Figure 4A:
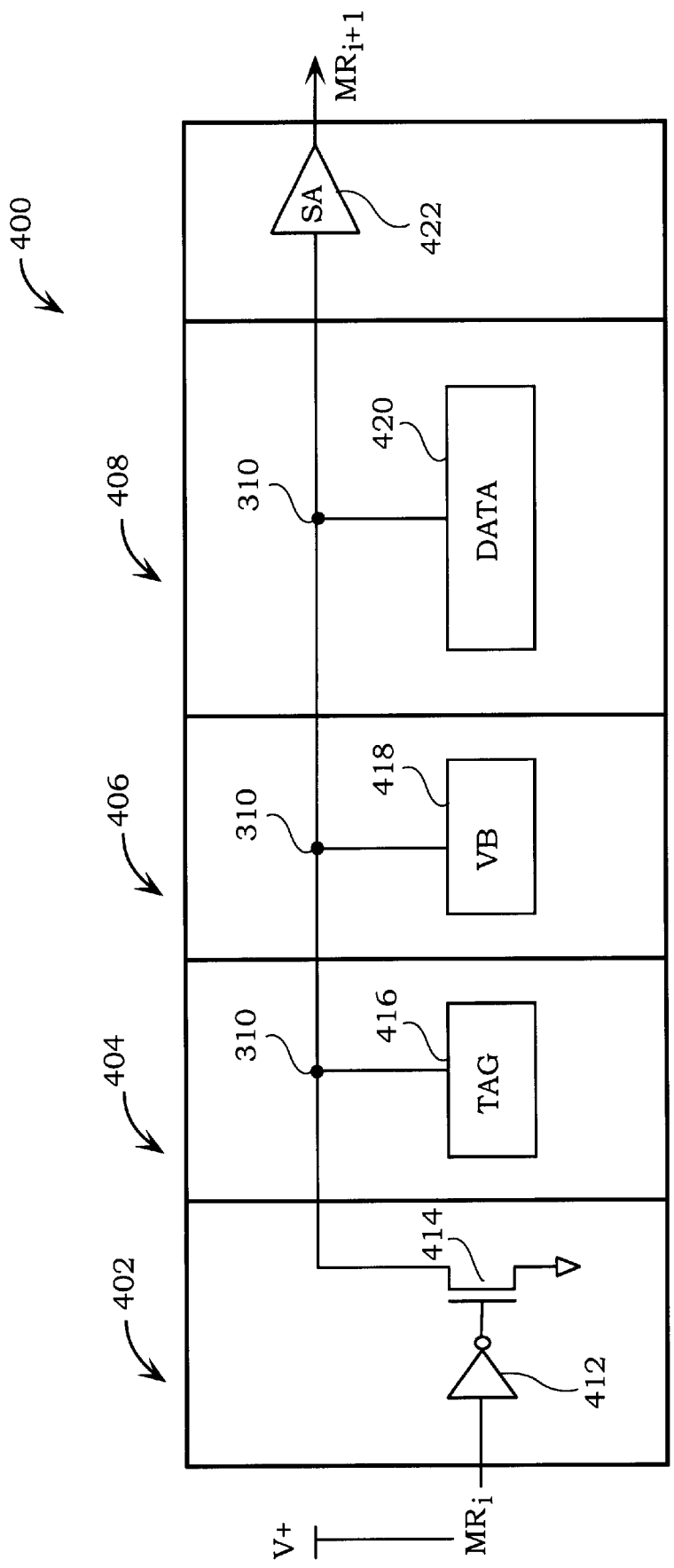
FIG. 4A shows a schematic diagram of an exemplary entry for implementing variable data widths in accordance with one embodiment of the present invention.

FIG. 4A shows a schematic block diagram of an exemplary entry 400 for implementing variable data widths in accordance with one embodiment of the present invention. The entry 400 includes a match result interface portion 402, a tag field 416, a valid bit field 418, a data field 420, and a sense amplifier 422. The match result interface portion 402 includes an inverter 412 and a transistor 414. The inverter 412 receives a match result $MR_i$, which may be either high or low. For example, a high $MR_i$ signal may indicate a hit in the previous block entry while a low $MR_i$ signal may indicate a miss. If the entry 400 is in the first (e.g., left-most) CAM block for searching data, then the $MR_i$ signal is coupled to supply voltage V+ so that the $MR_i$ signal is high. The inverter 412 inverts the input $MR_i$ signal, which is provided to the transistor 414. The transistor 414 turns off when the inverted input signal is low (e.g., $MR_i$ high) so as not to pull down the voltage at the output node 310. On the other hand, when the inverted input signal is high (e.g., $MR_i$ low), the transistor pulls down the voltage at the output node 310.

The output node 310 is coupled to the tag field 416, the valid bit field 418, and the data field 420. When any one of the bits in the tag field 416 or the data field 420 does not match the input data and tag value, or the valid bit in the valid bit field 418 is invalid, then the voltage at the node 310 is pulled down. This indicates that a match has not been found in the entry 400. In contrast, when all the bits in the tag field 416 and the data field 420 match the input data and tag value, and the valid bit in the valid bit field 418 is valid, the voltage at the output node is not pulled down (remains high), which indicates that a match has been found in the entry 400. The voltage at node 310 is provided as an input to the sense amplifier 422, which amplifies the input voltage for output as match result, $MR_{i+1}$, which may be encoded into an address or transmitted to the next entry in the block as an input.

It should be appreciated by one skilled in the art that the amplification of the search result 310 by the sense amplifier 422 to generate MRi+1 requires reasonably significant current consumption to obtain high speed operation. The power consumption from this match amplification may be a significant portion of overall power consumption for large capacity CAMs with thousands of stored entries. To help counter this issue, the match sense amplifiers 422 may be selectively enabled on an entry by entry basis as shown in FIG. 4B.

Figure 4B:
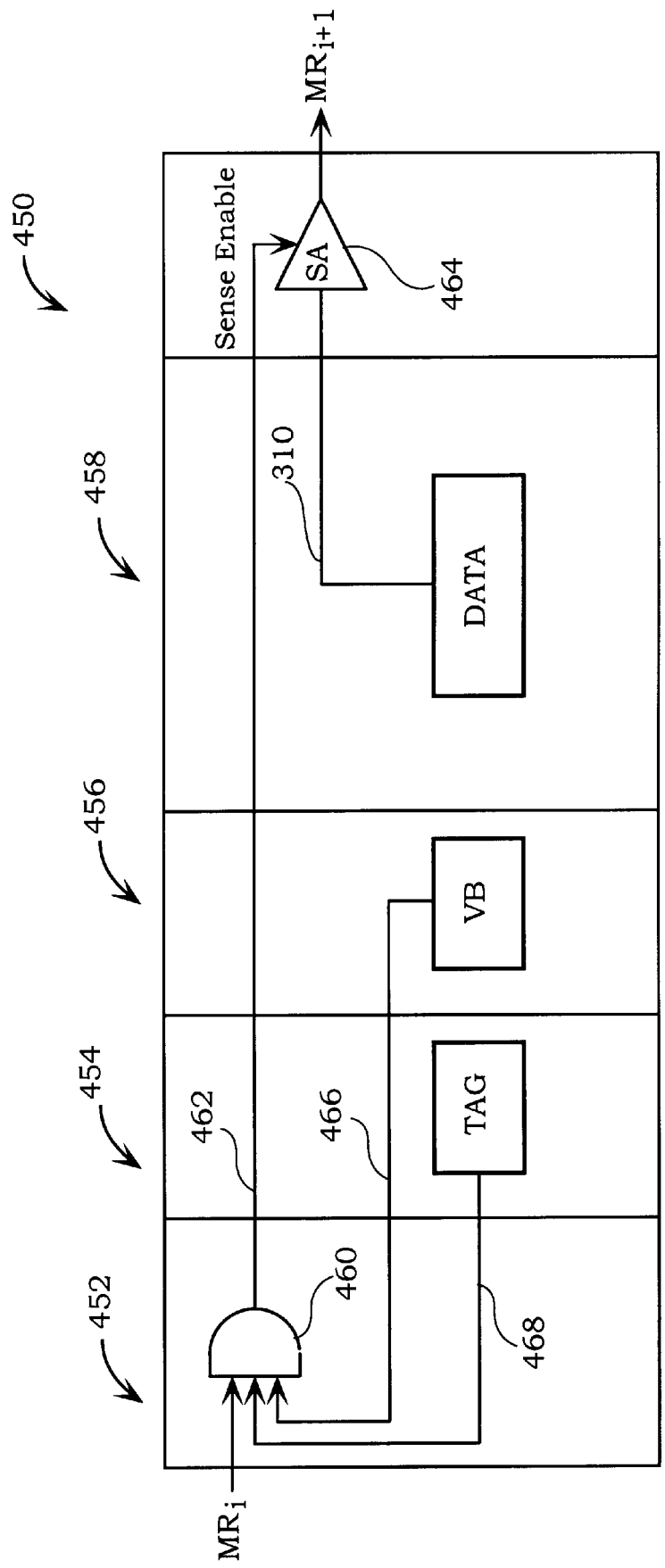
FIG. 4B illustrates a schematic diagram of an exemplary entry for saving power in accordance with one embodiment of the invention.

In the exemplary entry 450 shown in FIG. 4B, the MRi input, the tag comparison result 468 and the valid bit comparison result 466 are logically ANDed by the AND gate 460 to generate a local sense amplifier enable signal 462 to control the match sense amplifier 464. Using this technique allows each match sense amplifier to be enabled for only the entries which have MRi, tag and valid bit states which match the applied search inputs. As a result, only entries with the matching width tag, valid data and for which match results from previous blocks indicate a match will consume power to compare the data stored within the entry data field 458. Power savings result for CAM arrays which store entries of a number of widths (with different tag values) or invalid entries.

The power saving technique shown in FIG. 4B demonstrates an example using a combination of the MRi input, tag and valid bit comparison results to enable the local match sense amplifier 464. It should be obvious that any combination of one or more of these inputs may be used to achieve a partial reduction in sense amplifier power consumption without altering the intent.

Figure 5:
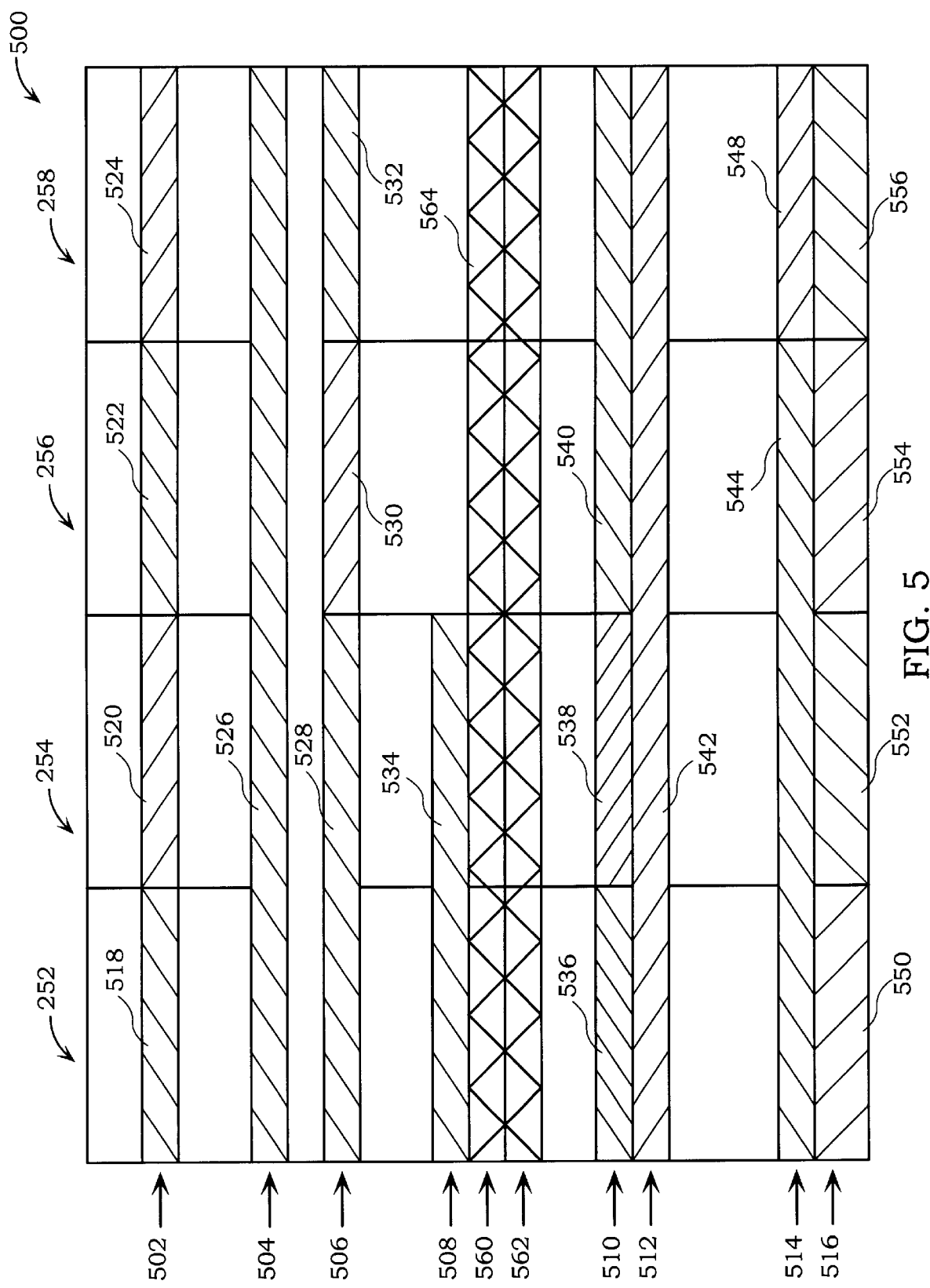
FIG. 5 is a logical block diagram of a CAM device illustrating variable widths of data that can be stored and searched for in its CAM blocks in accordance with one embodiment of the present invention.

FIG. 5 is a logical block diagram of a CAM device 500 illustrating variable widths of data that can be stored and searched for in the CAM blocks 252, 254, 256, and 258 in accordance with one embodiment of the present invention. As shown in this logical block diagram, the CAM device 500 stores data of variable sizes in 32-bit increments from 32-bit width to 128-bit width. For example, in rows 502 and 516, data of 32-bit width is stored in entries 518, 520, 522, 524, 550, 552, 554, and 556. On the other hand, in rows 504 and 512, data of 128 bits are stored for searching. A row 508 stores a single 64-bit data in entry 534.

Within a row, data of different widths may also be stored. For example, rows 506, 510, and 514 are used to store varying data widths. Specifically, the row 506 stores a 64-bit data in entry 528 along with a pair of entries 530 and 532 storing a 32-bit data each. Similarly, the row 510 stores 32-bit data in a pair of entries 536 and 538 along with a 64-bit data in entry 540. Likewise, the row 514 stores data of 96-bit width in entry 544 and data of 32 bits in entry 548. Other rows and entries in the CAM device 500 may be similarly configured so that all spaces may be used for storing data without wasting valuable CAM spaces. Data may also be stored across multiple rows when multi-mode encoders are used. For example, rows 560 and 562 of FIG. 5 are used to store a single 256-bit wide entry 564.

By thus storing data of variable widths for searching, the CAM devices of the present invention provide savings in CAM space and enhanced flexibility. In particular, the variable width storage and searching of the data provides substantial flexibility to users by allowing the tag bits to be programmed on an entry basis instead of block basis. Additionally, by storing and searching data of variable widths on individual entry basis, valuable CAM space is saved by eliminating unused or unusable CAM spaces associated with conventional CAM macros. The CAM device with the variable width storage and searching capabilities is particularly beneficial in multi-protocol applications such as IPv4, IPv6, ATM, MAC level switching, etc.

Figure 6A:
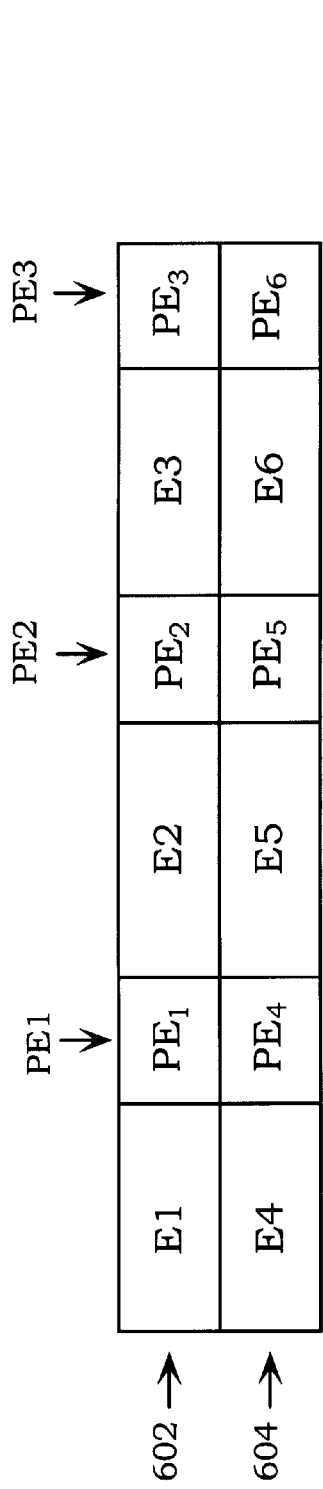
FIG. 6A shows a pair of rows and encoders PE1, PE2, and PE3 in accordance with one embodiment of the present invention.

In some embodiments, entries in a set of rows may be arranged in a single interleaved row. For example, FIG. 6A shows a pair of rows 602 and 604 and encoders PE1, PE2, and PE3 in accordance with one embodiment of the present invention. Each of the encoders PE1, PE2, and PE3 includes a pair of encoder portions. Specifically, the encoder PE1 includes encoder portions $PE_1$ and $PE_4$; the encoder PE2 includes encoder portions $PE_2$ and $PE_5$; and the encoder PE3 includes encoder portions $PE_3$ and $PE_6$. Row 602 includes entries E1, E2, E3, and associated encoder portions $PE_1$, $PE_2$, and $PE_3$, respectively. Similarly, row 604 includes entries E4, E5, and E6 with associated encoder portions $PE_4$, $PE_5$, and $PE_6$, respectively.

Figure 6B:
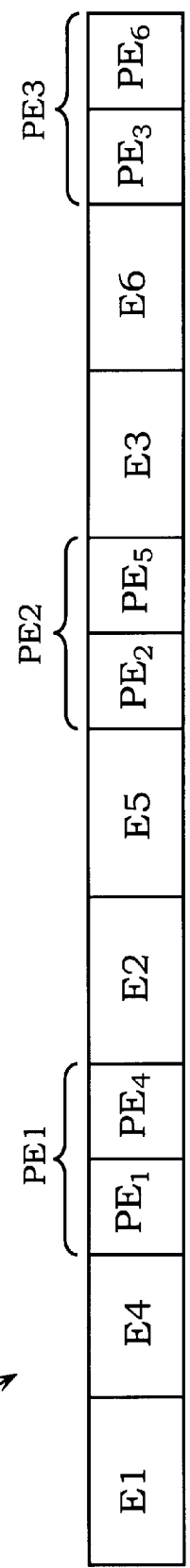
FIG. 6B illustrates an interleaved row that includes entries E1 to E6 in accordance with one embodiment of the present invention.

The entries in rows 602 and 604 may be interleaved in a single row. FIG. 6B illustrates an interleaved row 606 that includes the entries E1 to E6 in accordance with one embodiment of the present invention. In the interleaved row 606, entries E1 and E4 are provided in contiguous locations followed by associated encoder portions $PE_1$ and $PE_4$ of the encoder PE1. Then, entries E2 and E5 are provided followed by respective encoder portions $PE_2$ and $PE_5$. Entries E3 and E6 are then provided followed by associated encoder portions $PE_3$ and $PE_6$.

Figure 6C:
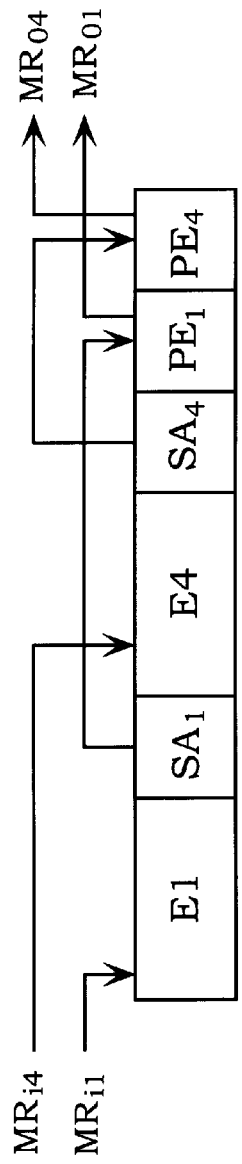
FIG. 6C shows a schematic diagram of input and output signals of entries E1 and E4 and associated encoder portions $PE_1$ and $PE_4$.

FIG. 6C shows a schematic diagram of input and output signals of entries E1 and E4 and associated encoder portions $PE_1$ and $PE_4$. Sense amplifiers $SA_1$ and $SA_2$ are provided to amplify output signals from the entries E1 and E4, respectively. In operation, the entries E1 and E4 receive input match result signals $MR_{i1}$ and $MR_{i4}$, respectively. The sense amplifiers $SA_1$ and $SA_4$ amplify output signals from the entries E1 and E4, respectively, and provide the amplified output signals to encoder portions $PE_1$ and $PE_4$, respectively. In response, the encoder portions $PE_1$ and $PE_4$ output match result output signals $MR_{o1}$ and $MR_{o4}$, respectively, which may be provided to next entries E2 and E5 in the interleaved row 606.

It should be understood that the various block diagrams may be embodied in any form which may include, for example, any suitable semiconductor substrate, printed circuit board, packaged integrated circuit, or software implementation. Accordingly, those skilled in the art will recognize that the present embodiments are to be considered as illustrative and not restrictive, and the invention is not to be limited to the details given herein, but may be modified within the scope and equivalents of the appended claims.

What is claimed is:

1. A variable width content addressable memory (CAM) device, comprising:
   a plurality of CAM blocks for storing a plurality of data of variable widths, each data having one or more data portions of one or more predetermined widths, each CAM block being configured to store a predetermined width portion of said data such that each data is stored in one or more of said CAM blocks, said CAM blocks receiving search data having a specified number of search data portions with each search data portion having said one or more predetermined widths, wherein each CAM block receives a search data portion of said search data for searching said search data in said CAM blocks; and
   a plurality of dual mode first encoders for concatenating said specified number of said CAM blocks to generate one or more search results, a set of said dual mode first encoders being configured to concatenate said specified number of CAM blocks to match the width of said search data, wherein the remaining dual mode first encoders generate said one or more search results when said concatenated CAM blocks contain data that matches said search data.

2. The variable width CAM device as recited in claim 1, wherein said one or more search results are addresses in said CAM blocks, said addresses specifying the locations of data that matches said search data.

3. The variable width CAM device as recited in claim 1, further comprising:
   a second encoder receiving said one or more search results for selecting one of said one or more search results for output according to a predefined algorithm.

4. The variable width CAM device as recited in claim 1, wherein each of said CAM blocks comprises a plurality of entries, each entry including a data field and a tag field, the data field being configured to store said predetermined width portion of data, the tag field being configured to store a set of tag bits indicating the overall width of data.

5. The variable width CAM device as recited in claim 4, wherein each entry in each CAM block receives a set of input tag bits indicating the width of said search data, wherein each entry generates a match result when said input tag bits match said stored tag bits and when said data portion matches said received search data portion.

6. The variable width CAM device as recited in claim 5, wherein each of said dual mode first encoders is associated with one of said CAM blocks, wherein each dual mode first encoder transfers search results from said associated CAM block when that dual mode first encoder is disabled and wherein said dual mode first encoders generate search results when enabled.

7. The variable width CAM device as recited in claim 6, wherein each entry further includes a valid bit field for storing a valid bit that indicates whether predetermined width data stored in that entry is valid, wherein each entry generates a search result only when a corresponding valid bit indicates that data stored in that entry is valid.

8. The variable width CAM device as recited in claim 4, wherein said plurality of entries in each CAM block is arranged in different rows and wherein the predetermined width portions of said plurality of data are stored in one row, wherein said set of dual mode first encoders is configured to concatenate entries located in the same rows in the concatenated CAM blocks.

9. The variable width CAM device as recited in claim 4, wherein said plurality of entries in each CAM block is interleaved in one or more rows.

10. The variable width CAM device as recited in claim 1, wherein said CAM blocks search said search data sequentially over multiple clock cycles.

11. The variable width CAM device as recited in claim 1, wherein each of said CAM blocks searches associated search data portions in parallel in a single clock cycle.

12. A variable width content addressable memory (CAM) device, comprising:
    a plurality of CAM blocks for storing a plurality of data having a plurality of widths, each CAM block having a plurality of entries, each entry being configured to store a predetermined width data portion of one of said plurality of data, each of said plurality of data being stored in one or more entries that are located in different CAM blocks, said CAM blocks receiving a search data having a specified number of search data portions such that each CAM block receives one search data portion having the predetermined width, wherein each entry in said CAM blocks is capable of generating a match result when the predetermined width data portion in that entry matches the search data portion of predetermined width; and
    a plurality of first encoders for sequentially coupling said plurality of CAM blocks in said specified number to match the width of said search data, each first encoder being associated with one CAM block for receiving match results from entries in the associated CAM block, wherein a set of said first encoders transmits match results from associated CAM blocks to next sequentially coupled CAM blocks as inputs, wherein each of the remaining first encoders generates a search result when said sequentially coupled CAM blocks contain data that matches said search data.

13. The variable width CAM device as recited in claim 12, further comprising:
    a second encoder coupled to said remaining first encoders to receive one or more search results, said second encoder selecting one of the received search results for output according to a predefined algorithm.

14. The variable width CAM device as recited in claim 12, wherein each of said plurality of data is stored in one or more entries in said CAM blocks, wherein said one or more entries include only one entry from any one of said CAM blocks.

15. The variable width CAM device as recited in claim 12, wherein each entry in said CAM blocks includes a tag field and a data field, the data field configured to store the predetermined width data portion of data, the tag field storing a set of tag bits that indicates the width of data associated with the predetermined width data portion.

16. The variable width CAM device as recited in claim 15, wherein each entry in each CAM block receives a set of input tag bits indicating the width of said search data, wherein each entry generates a match result when said input tag bits match the stored set of tag bits and when the stored predetermined width data portion matches a received portion of said search data.

17. The variable width CAM device as recited in claim 12, wherein each of said first encoders transmits said search results from the associated CAM block when that first encoder is disabled and wherein each of said first encoders generates a search result when that first encoder is enabled.

18. The variable width CAM device as recited in claim 16, wherein each entry includes a valid bit field for storing a valid bit that indicates whether a data portion stored in that entry is valid, wherein each entry generates a search result only when a corresponding valid bit indicates that the data portion stored in that entry is valid.

19. The variable width CAM device as recited in claim 12, wherein said plurality of entries in each CAM block is arranged in different rows and wherein the predetermined width portions of said plurality of data are stored in one row, wherein each first encoder in said set of first encoders is configured to transmit search results from the associated CAM block to entries located in the same row of the next CAM block.

20. The variable width CAM device as recited in claim 12, wherein said plurality of entries in each CAM block is interleaved in one or more rows.

21. The variable width CAM device as recited in claim 12, wherein said CAM blocks search said search data sequentially over multiple clock cycles.

22. The variable width CAM device as recited in claim 12, wherein each of said CAM blocks searches associated search data portions in parallel in a single clock cycle.

23. A variable width content addressable memory (CAM) device, comprising:
  a plurality of CAM blocks for storing data of variable widths, each CAM block having a plurality of entries, each entry being configured to store data of a first width, each CAM block receiving a first width search data portion of a search data for input to each entry in that CAM block, wherein each entry in said CAM blocks is capable of generating a match result when data in that entry matches the search data portion of the first width;
  a plurality of first encoders for concatenating said entries of said plurality of CAM blocks, each first encoder being associated with one CAM block for receiving match results from said entries in the associated CAM block, each first encoder being arranged to transmit said match results to a next sequentially coupled CAM block as inputs to entries in the next CAM block, wherein a set of said first encoders is adapted to transmit match results for concatenating entries in one or more CAM blocks to match the width of the concatenated entries and said search data, wherein each of the remaining first encoders generates a search result in response to match results of said concatenated entries; and
  a second encoder coupled to said plurality of first encoders to receive one or more search results, said second encoder selecting one of the received search results for output.

24. The variable width CAM device as recited in claim 23, wherein said plurality of entries in each CAM block is arranged in different rows and wherein the first width portions of each of the variable width data are each stored in one row, wherein each first encoder in said set of first encoders is configured to transmit match results from the associated CAM block to entries located in the same row of the next CAM block.

25. The variable width CAM device as recited in claim 23, wherein said plurality of entries in each CAM block is interleaved in one or more rows.

26. The variable width CAM device as recited in claim 23, wherein said CAM blocks search said search data sequentially over multiple clock cycles.

27. The variable width CAM device as recited in claim 23, wherein each of said CAM blocks searches associated search data portions in parallel in a single clock cycle.

28. The variable width CAM device as recited in claim 24, wherein each of the data of variable widths is stored in one or more entries in said CAM blocks, wherein said one or more entries include only one entry from any one of said CAM blocks.

29. The variable width CAM device as recited in claim 23, wherein each entry in the CAM blocks includes a tag field and a data field, the data field configured to store a portion of said variable width data in said first width, the tag field storing a set of tag bits that indicates the width of the variable width data associated with the first width portion.

30. The variable width CAM device as recited in claim 29, wherein each entry in each CAM block receives a set of input tag bits indicating the width of said search data, wherein each entry generates a match result when the input tag bits match said stored tag bits and when the stored data matches the received portion of said search data.

31. The variable width CAM device as recited in claim 29, wherein each entry includes a valid bit field for storing a valid bit that indicates whether data stored in that entry is valid, wherein each entry generates a search result only when a corresponding valid bit indicates that data stored in that entry is valid.

* * * * *

UNITED STATES PATENT AND TRADEMARK OFFICE
CERTIFICATE OF CORRECTION

PATENT NO. : 6,553,453 B1 Page 1 of 1
APPLICATION NO. : 09/654316
DATED : April 22, 2003
INVENTOR(S) : Gibson et al.

It is certified that error appears in the above-identified patent and that said Letters Patent is hereby corrected as shown below:

Column 7:
line 50, replace "with" with --width--.

Signed and Sealed this

Thirtieth Day of September, 2008

JON W. DUDAS
*Director of the United States Patent and Trademark Office*